United States Patent [19]

Nakagome et al.

[11] 4,048,005
[45] Sept. 13, 1977

[54] PROCESS FOR PRODUCING A LAMINATED METALLIC SHEET

[75] Inventors: Keisuke Nakagome; Toshiharu Suzuki, both of Ibaraki, Japan

[73] Assignee: Nitto Electric Industrial Co., Ltd., Ibaraki, Japan

[21] Appl. No.: 630,380

[22] Filed: Nov. 10, 1975

Related U.S. Application Data

[63] Continuation of Ser. No. 403,311, Oct. 3, 1973, abandoned.

[30] Foreign Application Priority Data

Oct. 2, 1972    Japan .................................. 47-99648

[51] Int. Cl.$^2$ .................. C07D 233/80; H01L 21/312
[52] U.S. Cl. ..................................... 156/630; 156/634; 156/802; 156/246; 156/309; 156/331; 260/30.4 N; 428/458; 548/328; 548/336
[58] Field of Search ................ 156/331, 3, 18, 242, 156/299, 309, 246, 630, 634, 901, 902, 665, 666; 428/458, 474; 260/30.2, 30.4 N, 32.6 NR, 32.6 NA, 33.4 P, 78 TF, 309.5; 427/405

[56] References Cited

U.S. PATENT DOCUMENTS

| 3,454,445 | 7/1979 | Durst et al. ......................... 428/458 |
| 3,533,879 | 10/1970 | Levine ................................. 156/332 |
| 3,582,458 | 6/1971 | Haller ................................... 428/458 |
| 3,640,969 | 2/1972 | Suzuki et al. ................... 260/30.4 N |
| 3,678,005 | 7/1972 | Rabilloud et al. ............... 260/33.4 P |
| 3,714,131 | 1/1973 | Hoback et al. .................. 260/33.4 P |
| 3,803,075 | 4/1974 | Kray et al. ........................... 428/458 |
| 3,839,354 | 10/1974 | Habermeier et al. ............ 260/309.5 |
| 3,856,559 | 12/1974 | Nakagome ........................... 156/331 |

*Primary Examiner*—Charles E. Van Horn
*Assistant Examiner*—Jerome W. Massie
*Attorney, Agent, or Firm*—Sughrue, Rothwell, Mion, Zinn and Macpeak

[57] ABSTRACT

This invention provides a process for producing a heat resistant metallic laminated sheet which is composed of mutually insulated outer metallic sheets or foils and an inner binder layer sandwiched therebetween.

In this process, the binder layer is a film of a heat resistant heterocyclic polymer from which volatile matter is substantially removed. The sandwiched structure composed of the outer metallic sheets and the binder film put therebetween is bonded at a temperature range above the heat distortion temperature of the binder film to form the metallic laminated sheet.

20 Claims, No Drawings

PROCESS FOR PRODUCING A LAMINATED METALLIC SHEET

This application is a continuation of Ser. No. 403311, filed Oct. 3, 1973, now abandoned.

BACKGROUND OF THE INVENTION

1. Field of the Invention

This invention relates to a metallic laminated sheet, and more particularly to a process for producing a heat resistant metallic laminated sheet composed of mutually isolated metallic sheets or foils and heat resistant, insulating films of heterocyclic polymer put between the metallic sheets or foils.

2. Description of the Prior Art

Previously metallic laminated sheets having metallic sheets or foils on both surfaces were usually produced by compressing and fusing an intervening film of thermoplastic polymer, such as, polyethylene, polypropylene, vinyl chloride and polyester, put between the metallic sheets or foils, or by sticking the metallic sheets or foils together with the binder. It is difficult to obtain a heat resistant laminated sheet using such polymers due to their low softening points. Various types of heat resistant heterocyclic polymers, for example, polyimide, polyamideimide, polybenzimidazol, polyhydantoin, polythiazol and polyimidazopyrrolone have been known to be suitable for producing the heat resistant film. The copolymers of said heterocyclic polymers are also suitable for use as heat resistant films. These films are known to have the excellent mechanical and electrical properties even in a temperature range below $-40°$ C and above $150°$ C. These heat resistant heterocyclic polymers, however, are the condensation polymers, and are usually produced solution reactions, so that the heat resistant films must be produced by stretching and drying the polymer solutions. Since the resultant hardened film is not fused and insoluble in the solvent which is used in the synthesis, it is the usual practice to use precursors of the heterocyclic polymer or the unset coating or to use the other binder for laminating some metallic sheets or foils. Epoxy resin or the modified resin thereof, nitrile rubber binders, acetal binders and silicone resins are known to be useful as such binders, but these exhibit poor heat resistance as compared with that of the heterocyclic polymers. Accordingly, the heat resistance of the resultant laminated sheet can not exceed that of the binder itself.

On the other hand, fluorocarbon resins used as a binder for some laminated sheets have excellent heat resistance. Laminated sheets made with such fluorocarbon resin binders however, has the defect that printing and covering on the binder layer, if exposed, are difficult.

As a binder composed of the precursor of the heterocyclic polymer or the unset coating, there may be polyamide acid, low molecular polyimide prepolymer and polyamide imide. Polyamide acid, low molecular polyimide prepolymer or the like prepolymer generates a volatile condensed product in the bonding step. On the other hand, the polyamide imide unset binder, which sticks on the metallic sheets or foils due to the characteristic of lower distortion temperature compared with that of polyamideimide itself, brings out foaming or irregularity of the metallic surface and exhibits poor insulation, since the excess amounts of solvent for the unset material which are retained in the binder are difficult to expel in the production of the laminated sheet which is composed of metallic outside sheets and a binder layer put therebetween. Besides, even if an attractive laminated sheet is produced by compression at low temperature, the bonding effect of the binder will be broken by abrupt heating, due to excess amounts of residual volatile matter in the binder.

SUMMARY OF THE INVENTION

This invention is intended to overcome the above difficulties in the prior art and to produce easily metallic laminated sheet having excellent mechanical, thermal and electrical properties using a film of heat resistant heterocyclic polymer from which the volatile matter is substantially removed.

The heat resistant heterocyclic polymer has been believed not to have thermal bonding properties in a state wherein volatile matter had been substantially removed, from the polymer, because the heat resistant heterocyclic polymer exhibits no fusing point.

Contrary to conventional thought, however we, have discovered that the polymer, after having been subjected to a final heat treatment keeps excellent thermal bonding properties at temperatures in the range above the heat distortion temperature of the polymer, thus enabling one to produce well bonded metallic laminated sheets.

DETAILED DESCRIPTION OF THE INVENTION

According to one embodiment of the process of this invention, a solution of heat resistant heterocyclic polymer is applied to at least one surface of a metallic sheet or foil, and is heated and dried thereon to form a strong film from which the volatile matter is substantially removed.

Thus, a heat resistant film of the heterocyclic polymer is adhered fixedly to the surface of a metallic sheet or foil to be bonded. Then, coated metallic sheets or foils are laminated so that the coated films are brought into intimate contact with each other, and compression is applied to the laminated structure at a temperature in the range higher than the heat distortion temperature of the polymer film, thereby to produce a heat resistant laminated sheet. Each of the polymers to be applied on the metallic sheet surfaces may have mutually different heterocycles.

According to another embodiment of this invention, the metallic sheet or foil coated with the polymer film is laminated to an uncoated metallic sheet or foil, and compression is applied to the laminated structure at a temperature in the range above the heat distortion temperature of the polymer.

According to another embodiment of this invention, a solution of heat resistant heterocyclic polymer is first applied on a surface of a slip sheet and heated and dried thereon to form a strong film from which the volatile matter is substantially removed. Then, the film thus formed is peeled off from the surface of the slip sheet. The metallic sheets or foils and the polymer films are laminated in turn to form a sandwich structure, and compression is applied thereto at a temperature in the range above the heat distortion temperature.

As the heat resistant heterocyclic polymer there are polyimide, polyamide imide, polybenzimidazol, polyhydantoin, polyparabanic acid, polythiazol and polyimidozopyrrolidone. The polymer is not restricted to these polymers and may be any heterocyclic polymer. The copolymers of these polymers are also useful.

The high molecular polymer having film forming ability is produced by the solution polymerization. Solvents for the polymer include N-methyl-2-pyrrolidone, dimethylacetamide, dimethylformamide and dimethylsulfoxide, but are not restricted to these solvents. The inherent viscosity of the polymer may be more than 0.4, preferably more than 0.5, in order to obtain a strong film and to increase the bonding strength of the resulting laminated sheet. Such a heat resistant polymer solution may be applied uniformly on at least one surface of the metallic sheet or foil or on the surface of a slip sheet, and then is heated to remove volatile matter and to solidify the film. The drying of the polymer solution is carried out first at a temperature range considerably lower than the boiling point of the solvent, and then at gradually elevated temperatures which finally reaches a temperature higher than the boiling point of the solvent.

Some of the polymers are tinged with deep color during drying in air. Drying of the polymer solution in an inert gas atmosphere is effective to avoid such coloring.

The volatile matter in the heat resistant polymer film includes solvent, unreacted constituents and thermally decomposed products, and the amount of volatile matter changes with the thickness and heat resistance of the film, the boiling point of the solvent, the drying temperature and time, and other conditions. Generally, the amount of the volatile matter is determined by the weight loss of the film which is dried at a selected temperature between 250° C and 350° C for more than 1 hour. The amount of the volatile matter remaining in the heat resistant polymer film determined under such conditions is preferably lower than 5 weight %. As the heat resistant heterocyclic polymer is more hygroscopic than other polymers and often exhibits high weight loss if exposed to the atmospheric air, the measurement of the amount of volatile matter is usually carried out after dehydrating the polymer at 150° C for 1 hour. The heat distortion temperature of the heat resistant heterocyclic polymer is measured by a device for measuring the linear expansion coefficient of the film made from quartz or a thermo-mechanical analyser (refer for example, to IEEE 69C 33 EI-89 ELECTRICAL INSULATION CONFERENCE PROCEEDING 1969, pp. 267-269) modified for measuring the expansion coefficient of the film. If the film set in said measuring device is heated at a constant heating rate, the film is first stretched at a rate corresponding to its linear expansion coefficient but at a higher rate after reaching a certain temperature. This temperature is determined as the heat distortion temperature of the film. The heat distortion temperature of the heat resistant heterocyclic polymer is usually higher than 200° C. But, it must be noticed that the polymer which is not fully dried exhibits a heat distortion temperature lower than that of the same polymer from which the solvent is substantially removed.

The metallic laminated sheet bonded between hot plates is cooled below the heat distortion temperature of the bonding film and taken out after releasing the compression.

The metallic sheet or foil may be the sheet or foil of iron, aluminum, copper, zinc, nickel, silver, stainless steel, brass, white copper or other metals and alloys. The metallic sheet or foil may be plated, roughtned, oxidized or subjected to the other surface treatment prior to the polymer coating treatment. The mechanical or electrochemical surface roughening treatment or the surface oxidizing treatment is especially effective to obtain high bonding force.

In the present invention, the metallic sheet is a sheet having a thickness of about 0.5 to 3.0 mm, and the metallic foil is a foil having a thickness of about 10 to 100 $\mu$. As the plating, chromium plating, nickel plating, copper plating and etc. can be employed (on one or both surfaces); for roughening a mechanical treatment such as sand blasting or honing, a chemical corrosion (chemical treatment) with ferric chloride or cupric chloride and an electrochemical treatment such as electrolysis corrosion can be employed; and as the oxidizing treatment, an alumite treatment, chromate treatment, etc. can be employed.

Thus, the heat resistant film of heterocyclic polymer used for bonding the metallic sheets or foils is in such a state that the volatile matter is substantially fully removed. Accordingly, the foaming of the polymer film due to the residual solvent is fully prevented during lamination. Besides, the resultant laminated sheet is very resistant to abrupt thermal shock and is not deformed. Furthermore, according to the invention metallic laminated sheets having good heat dissipating property can be obtained, since bonding films can be used having thicknesses less than 80 $\mu$.

EXAMPLE 1

A solution (A) prepared by adding trimellitic anhydride 0.7 mol, isophthalic acid 0.3 mol and 4,4'-diphenylmethanediisocyanate 1.05 mols to a solution of N-methyl-2-pyrrolidone, wherein the solution (A) has the inherent viscosity of 0.7, was applied to a surface of a copper plate having 2 mm thickness as a layer of 150 $\mu$ thickness. Then, the coated copper sheet was dried at 130° C, 200° C, respectively, to obtain a preliminary laminating sheet (B) coated with a polymer film having the thickness of 35 $\mu$ and including volatile matter in an amount of 1.5 weight %. The heat distortion temperature of the film fixed on the copper sheet was 268° C. The amount of the volatile matter and the heat distortion temperature were measured in the above described manner.

On the other hand, a polyamide imide solution (A) was applied on a treated surface of an oxidized electrolytic copper foil as a layer of 150 $\mu$ thickness, and dried thereon at 130° C, 200° C and 250° C, respectively, to obtain a preliminary laminating foil (C) coated with a polymer film containing volatile matter in an amount of 1.3 weight % and having a thickness of 35 $\mu$. The heat distortion temperature of the film on the copper foil was 270° C.

Both preliminary laminating sheet (B) and preliminary laminating foil (C) were placed face to face and a compression pressure of 1 Kg/cm$^2$ was applied to the lapped structure at 280° C for 5 min.

A higher compression force of 35 Kg/cm$^2$ was successively applied to the lapped structure for 30 min., and the resultant liminated foil was taken out after being cooled below 100° C to obtain a laminated sheet having two copper surfaces. No defects were observed on the bonding layer of the laminated sheet after heating the sheet rapidly to 285° C, and a slight bulge was formed on the copper foil surface by heating the laminated sheet at 300° C. This means that the critical foaming temperature of the preliminary laminating sheet (B) in the rapid heating was about 300° C. The force required for peeling off the cooper foil from the copper sheet was 2.4 Kg per 1 cm width, and the dielectric breakdown voltage was 10.5 KV.

Reduction in peeling strength and dielectric breakdown voltage were not observed even after the rapid heating. The resultant laminated sheet can be used for a base plate of a printed circuit which is required to have good solderability and high heat dispipating properties. Printing of reistor paste is possible on the partly exposed polymer film surface.

EXAMPLE 2

An oxidized surface of a base electrolytic copper foil was brought into intimate contact with a polymer film surface of the preliminary laminating foil (C) obtained in Example 1. The lapped structure was compressed first with a pressure of 0.8 Kg/cm$^2$ at 290° C for 5 min., and then with a pressure of 40 Kg/cm$^2$ for 45 min. After being cooled, the laminated sheet was taken out and was found to exhibit high peeling strength. No defects was observed in the bonding layer after its being heated rapidly to 280° C, and the dielectric breakdown voltage was 5.6 KV. The heat cycle, including cooling down to −75° C and heating up to 200° C, was repeated 100 times on the laminated sheet, but no defects were caused.

This laminated sheet can be used as the flexible base plate for two surface printed circuits.

REFERRENTIAL EXAMPLE I

The polyamide imide solution (A) obtained in Example 1 was applied on a treated surface of an oxidized electrolytic copper foil as a layer of 150 $\mu$ thickness, and was dried thereon at 180° C in order that the volatile matter would be in an amount of 10 weight %. An uncoated foil of electrolytic copper whose surface was oxidized was lapped on said preliminary laminating foil, and the lapped structure was laminated under the same conditions as in Example 2. Irregularity was observed on the copper foil surface of the resultant laminated sheet. On other hand, the good laminated sheet was obtained by compressing the lapped structure at 210° C, but the resultant laminated sheet caused surface irregularity after being heated rapidly to 260° C.

EXAMPLE 3

The polyamide imide solution (A) in Example 1 was applied on a Teflon (Trademark for to tetrafluoroethylene polymer by E. I. du Pont de Nemours & Co.) sheet and heated and dried thereon to produce a film (D) having the thickness of 30 $\mu$, containing the volatile matter in an amount of 1.0 weight % and exhibiting heat distortion temperature of 270° C.

This film (D) was put between an aluminum foil having a thickness of 50 $\mu$ and an aluminum sheet having a thickness of 1 mm, the contact surface of each of said foil and sheet being roughened, and the sandwiched structure was compressed first with a pressure of 0.75 Kg/cm$^2$ at 290° C for 10 min. and then with a pressure of 30 Kg/cm$^2$ for 40 min. After being cooled down to 70° C, a laminated sheet having two mutually insulated, smooth, aluminum surfaces was obtained. No defects were observed in the bonding layer upon rapid heating of the laminated sheet to 280° C. The force required for peeling off the aluminum foil from the film was 2.0 Kg per 1 cm width.

This laminated sheet can be used for a heat generator having favorable heat dissipating properties by chemically etching the foil surface.

EXAMPLE 4

A polyamide imide hydantoin copolymer solution (E) having inherent viscosity of 0.7 was prepared by reacting trimellitic anhydride 0.12 mol, 4,4'-diphenylmethane diisocyanate 0.2 mol and diglicine derivative (for example, N,N'-biscarboethoxymethyl-4,4'-diaminodiphenyl methane) 0.08 mol with m-cresol. The obtained polyamide imide hydantoin copolymer solution was applied on both surfaces of an iron sheet having a thickness of 2 mm., and was finally at 240° C to obtain a preliminary laminating sheet coated with a binder film having a thickness of 35 $\mu$ and containing the volatine matter in an amount of 0.8 weight %. This preliminary laminating sheet (F) was put between preliminary laminating sheets (B) of Example 1, and the laminated structure was compressed preliminarily with a pressure of 1 Kg/cm$^2$ at 280° C for 10 min. and then with a pressure of 25 Kg/cm$^2$ for 40 min.

No defects were observed in the bonding layer of the resultant laminated sheet after its being heated rapidly to 280° C.

EXAMPLE 5

The film (D) in Example 3 was put between two of the said preliminary laminating sheets (C) of Example 1, and the resultant laminated structure was compressed under the same conditions as in Example 3. Thus, a heat resistant and flexible substrate having two copper surfaces and thick bonding films was obtained.

No defects were observed in the bonding layer of the laminated sheet after its being heated rapidly to 280° C.

EXAMPLE 6

The heat distortion temperature of a heat resistant polyhydantoin film (I-DO-40809 Bayer A. G.) produced by the liquid stretching process was 279° C. and the amount of volatile matter measured at 250° C after the preliminary drying was 2 weight %. This film was flexible and had a thickness of 60 $\mu$ and a tensile strength of more than 10 Kg/mm$^2$. This polyhydantoin film was put between a pair of electrolytic copper foils having a thickness of 60 $\mu$ and having a roughened surface, and the laminated structure was compressed at 290° C. The resultant laminated sheet exhibited high resistance to peeling off from the copper foil, and no defects were observed after rapid heating to 260° C.

As particularly described above, this invention makes use of the heat resistance, resistance to a cold atmosphere, the adhesive property, and the mechanical strength and electric insulating properties of the heterocyclic polymers, and provides a metallic laminated sheet composed of mutually insulated metal sheets and exhibiting favorable heat resistance and heat dissipating properties. The heterocyclic polymer tends to exhibit a low heat distortion temperature in cases where the polymer contains volatile matter derived from reactive parts of the polymer or the solvent. Accordingly, where the polymer containing the volatile matter is applied between metallic sheets or foils, the resulting laminated sheet exhibits poor heat resistance due to the residual volatile matter confined between the metal sheets or foils.

Since a preliminarily set polymer film is used as the bonding layer and the laminated structure is compressed to bond at a temperature in a range higher than the heat distortion temperature of the polymer in accordance with the invention, the heat resistance of the polymer is not influenced by the residual volatile matter. Therefore, the resultant laminated sheet is highly resistant to thermal shock as described in the foregoing Examples. Besides, as the intermediate bonding film layer is not incorporated with another binder, the reduction of the dielectric breakdown voltage observed in the lamination of insulating sheets having mutually different dielectric ratios is never caused.

While the invention has been described in detail and with reference to specific embodiments thereof, it will be apparent to one skilled in the art that various changes and modifications can be made therein without departing from the spirit and scope thereof.

What is claimed is:

1. In a process for the production of heat resistant laminated articles comprising metallic sheets or foils with a polymer binder film laminated therebetween, the improvement comprising:

providing a binder film comprising a film of heat resistant heterocyclic polymer composed of polyamide imide hydantoin which exhibits no fusing point, said polymer film having an inherent viscosity greater than about 0.4, and a volatile matter content below about 5.0% by weight, and laminating said metallic sheets or foils with said binder film therebetween under pressure and at temperature above the heat distortion temperature of said binder film.

2. A process for producing a heat resistant metallic laminated article according to claim 1, in which the metallic sheets or foils comprise at least one anodized aluminum sheet having a thickness in the range of from about 0.5 to about 3.0mm.

3. The process according to claim 2, wherein said aluminum sheet or foil is preliminarily plated with nickel.

4. A process for producing a heat resistant metallic laminated article according to claim 1, in which the metallic sheets or foils comprise at least one copper sheet or foil having a thickness in the range of from about 10 to about 100 $\mu$.

5. The process of claim 4, wherein said copper sheet or foil is preliminarily plated with nickel.

6. A process for producing a heat resistant metallic laminated article according to claim 1, in which at least one surface of the laminated article is formed by an iron sheet having a thickness in the range of from about 0.5 to about 3.0mm.

7. A process for producing a heat resistant metallic laminated article according to claim 1, in which a binder film is preliminarily adhered to at least one surface of each metallic sheet or foil.

8. A process for producing a heat resistant metallic laminated article according to claim 1, in which a binder film is preliminarily adhered to at least one surface of at least one metallic sheet or foil, and at least one of said binder film coated sheets or foils is laminated with at least one uncoated metallic sheet or foil.

9. A process for producing a heat resistant metallic laminated article according to claim 1, in which a discrete binder film is produced preliminarily and is laminated between uncoated metallic sheets or foils.

10. A process for producing a substrate for use in the manufacture of printed circuit boards further comprising chemically etching at least a part of the exposed metallic surface of a metallic laminated article produced according to claim 1.

11. In a process for the production of heat resistant laminated articles comprising metallic sheets or foils with a polymer binder film laminated therebetween, the improvement comprising:

providing a binder film comprising a film of heat resistant heterocyclic polymer composed of polyhydantoin which exhibits no fusing point, said polymer film having an inherent viscosity greater than about 0.4, and a volatile matter content below about 5.0% by weight, and laminating said metallic sheets or foils with said binder film therebetween under pressure and at a temperature above the heat distortion temperature of said binder film.

12. A process for producing a heat resistant metallic laminated article according to claim 11, in which the metallic sheets or foils comprise at least one anodized aluminum sheet having a thickness in the range of from about 0.5 to about 3.0mm.

13. The process according to claim 12, wherein said aluminum sheet or foil is preliminarily plated with nickel.

14. A process for producing a heat resistant metallic liminated article according to claim 11, in which the metallic sheets or foils comprise at least one copper sheet or foil having a thickness in the range of from about 10 to about 100$\mu$.

15. The process of claim 14, wherein said copper sheet or foil is preliminarily plated with nickel.

16. A process for producing a heat resistant metallic laminated article according to claim 11, in which at least one surface of the laminated article is formed by an iron sheet having a thickness in the range of from about 0.5 to about 3.0mm.

17. A process for producing a heat resistant metallic laminated article according to claim 11, in which a binder film is preliminarily adhered to at least one surface of each metallic sheet or foil.

18. A process for producing a heat resistant metallic laminated article according to claim 11, in which a binder film is preliminarily adhered to at least one surface of at least one metallic sheet or foil, and at least one of said binder film coated sheets or foils is laminated with at least one uncoated metallic sheet or foil.

19. A process for producing a heat resistant metallic laminated article according to claim 11, in which a discrete binder film is produced preliminarily and is laminated between uncoated metallic sheets or foils.

20. A process for producing a substrate for use in the manufacture of printed circuit boards further comprising chemically etching at least a part of the exposed metallic surface of a metallic laminated article produced according to claim 11.

* * * * *